United States Patent
Soma et al.

(10) Patent No.: US 8,039,800 B2
(45) Date of Patent: Oct. 18, 2011

(54) LIGHT DETECTOR, LIGHT DETECTING APPARATUS, INFRARED DETECTOR AND INFRARED DETECTING APPARATUS

(75) Inventors: Fumihito Soma, Tokyo (JP); Yoshikatsu Kuroda, Tokyo (JP); Kazunori Masukawa, Tokyo (JP); Masahiro Kato, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 12/762,680

(22) Filed: Apr. 19, 2010

(65) Prior Publication Data

US 2011/0073762 A1    Mar. 31, 2011

(30) Foreign Application Priority Data

Sep. 29, 2009    (JP) ................................. 2009-224994

(51) Int. Cl.
*G01J 5/20*    (2006.01)
(52) U.S. Cl. .................................................. 250/338.4
(58) Field of Classification Search .................. 250/330, 250/331, 332, 333, 334, 338.1–338.5, 339.01–339.15, 250/340, 341.1–341.8
See application file for complete search history.

(56) References Cited

U.S. PATENT DOCUMENTS

| | | | | |
|---|---|---|---|---|
| 3,944,835 A | * | 3/1976 | Vosburgh | .................... 250/487.1 |
| 5,877,500 A | * | 3/1999 | Braig et al. | .................... 250/353 |
| 2009/0272903 A1 | | 11/2009 | Kato et al. | |

FOREIGN PATENT DOCUMENTS

| | | |
|---|---|---|
| JP | 5-218469 A | 8/1993 |
| JP | 2000-156513 A | 6/2000 |
| JP | 2009-253173 A | 10/2009 |

OTHER PUBLICATIONS

Liu et al., "Optoelectronic integration of quantum well intersubband photodetectors for two-dimensional array fabrication," 1996, SPIE Proceedings, vol. 2694, pp. 148-156.*

* cited by examiner

*Primary Examiner* — Kiho Kim
(74) *Attorney, Agent, or Firm* — Westerman, Hattori, Daniels & Adrian, LLP (57) ABSTRACT

An infrared detector which converts entering infrared IR into light in a different wavelength band, and which detects the converted light in the different wavelength band includes: a convex-concave structure provided on a light acceptance surface of the infrared detector; and a metal film provided on an outer circumferential face of the light detector other than the light acceptance surface thereof, the metal film covering the outer circumferential face. In the infrared detector, light which enters the light detector after passing through the convex-concave structure and the converted light in the different wavelength band are confined inside the light detector: by causing the entering light to be reflected on the metal film; by causing light reflected on the metal film to be reflected on the convex-concave structure; and by causing the converted light in the different wavelength band to be reflected between the metal film and the convex-concave structure.

9 Claims, 5 Drawing Sheets

LIGHT DETECTOR, LIGHT DETECTING APPARATUS, INFRARED DETECTOR AND INFRARED DETECTING APPARATUS

TECHNICAL FIELD

The present invention relates to a light detector, a light detecting apparatus, an infrared detector and an infrared detecting apparatus which detect light such as infrared.

BACKGROUND ART

Infrared detectors for middle- and far-infrared bands (for example, bands of wavelengths from 3 μm to 12 μm) which have been put into practical use include: a detector using HgCdTe which is a group II-VI compound semiconductor; a QWIP (Quantum Well Infrared Photo-detector) using a superlattice of group III-V compound semiconductors (for example, GaAs/AlGaAs or the like); and a QDIP (Quantum Dot Infrared Photo-detector) using a quantum dot.

CITATION LIST

Patent Literature 1

Japanese Patent Application Publication No. 2000-156513

Patent Literature 2

Japanese Patent Application Publication No. Hei 05-218469

SUMMARY OF INVENTION

Technical Problem

Among these infrared detectors, the infrared detector using HgCdTe is capable of having high sensitivity. However, the infrared detector using HgCdTe has difficulty in its high-quality crystal growth due to the low melting point and high vapor pressure of Hg, and accordingly, has a very low yield particularly when used for an image sensor. Furthermore, since a high-quality substrate (CdTe or the like) having a large area cannot be obtained, it has been difficult to produce an image sensor having a large number of pixels.

A QWIP is configured to detect infrared by causing electrons to transit between energy levels of discrete electrons in the quantum well by absorption of infrared radiation, thereby causing a photo-current to flow therebetween. Since formation of a quantum well can be achieved by a superlattice structure, a high-quality image sensor having a large area can be produced through a well-established GaAs crystal-growth process. However, since electrons are one-dimensionally quantized only in a stacking direction, a QWIP does not have sensitivity to light perpendicularly-incident on a plane, and sensitivity thereof has been very low. Additionally, the process for improvement in sensitivity is complex because it requires formation of a structure enabling scattering of entering light, confinement of entering light, and the like (Patent Literatures 1 and 2).

In a QDIP, a quantum well is formed through self-organized dot growth, and electrons are quantized by being three-dimensionally confined. Such a structure has sensitivity to perpendicular entering light, and a low possibility of having a photoexcited electron recaptured by a quantum well. Accordingly, sensitivity of a QDIP is higher than that of a QWIP, but is lower than that of HgCdTe.

Meanwhile, there is a method for enhancing sensitivity in which avalanche amplification is applied to electrons obtained by a QWIP or QDIP. However, this method has a problem of leakage of light from inside the detector.

As described above, although various proposals have been made for infrared detectors, they are still insufficient in terms of eventual detection sensitivity. Moreover, in order to execute observation in middle- and far-infrared bands in the cosmic space, infrared having a very low light intensity is required to be detected in a wide viewing angle and at high resolution. To achieve this, an image sensor which is made of a highly sensitive material and has a large area (a large number of pixels) is required. However, it has been difficult to produce an image sensor satisfying both of these requirements at the same time.

The present invention is made in consideration of the above problem, and an object of the present invention is to provide a light detector, light detecting apparatus, infrared detector and infrared detecting device which have high detection sensitivity.

Solution to Problem

A first aspect of the present invention to solve the above-mentioned problems provides a light detector for detecting light which includes: a convex-concave structure provided on a light acceptance surface of the light detector; and a metal film provided on an outer circumferential face of the light detector other than the light acceptance surface thereof, the metal film covering the outer circumferential face. In the light detector, light which enters the light detector after passing through the convex-concave structure is confined inside the light detector: by causing the light to be reflected on the metal film; and by causing light reflected on the metal film to be reflected on the convex-concave structure.

A second aspect of the present invention to solve the above-mentioned problems provides a light detector which converts light entering the light detector into light in a different wavelength band, and which detects the converted light in the different wavelength band, the light detector including: a convex-concave structure provided on a light acceptance surface of the light detector; and a metal film provided on an outer circumferential face of the light detector other than the light acceptance surface thereof, the metal film covering the outer circumferential face, the light detector. In the light detector, the converted light in the different wavelength band is confined inside the light detector by causing the light to be reflected between the metal film and the convex-concave structure.

A third aspect of the present invention to solve the above-mentioned problems provides a light detector which converts light entering the light detector into light in a different wavelength band, and which detects the converted light in the different wavelength band, the light detector including: a convex-concave structure provided on a light acceptance surface of the light detector; a metal film provided on an outer circumferential face of the light detector other than the light acceptance surface thereof, the metal film covering the outer circumferential face. In the light detector, light which enters the light detector after passing through the convex-concave structure and the converted light in the different wavelength band are confined inside the light detector: by causing the light entering the light detector to be reflected on the metal film; by causing light reflected on the metal film to be reflected on the convex-concave structure; and by causing the converted light in the different wavelength band to be reflected between the metal film and the convex-concave structure.

A fourth aspect of the present invention to solve the above-mentioned problems provides the light detector according to any one of the first to third aspects, characterized in that, the outer circumferential face is formed to be inclined to the light acceptance surface, and the metal film is provided to cover the outer circumferential face formed to be thus inclined.

A fifth aspect of the present invention to solve the above-mentioned problems provides a light detecting apparatus characterized by including the light detector according to any one of the first to third aspects used therein.

A sixth aspect of the present invention to solve the above-mentioned problems provides an infrared detector which converts entering light in far- to middle-infrared band into light in near-infrared to visible band and which detects the converted light in the near-infrared to visible band, the infrared detector including: a convex-concave structure provided on a light acceptance surface of the infrared detector; and a metal film provided on an outer circumferential face of the infrared detector other than the light acceptance surface thereof, the metal film covering the outer circumferential face, infrared detector. In the infrared detector, light in the far- to middle-infrared band which enters the infrared detector after passing through the convex-concave structure and the converted light in the near-infrared to visible band are confined inside the infrared detector: by causing the light in the far- to middle-infrared band which enters the infrared detector to be reflected on the metal film; by causing light in the far- to middle-infrared band which is reflected on the metal film to be reflected on the convex-concave structure; and by causing the converted light in the near-infrared to visible band to be reflected between the metal film and the convex-concave structure.

A seventh aspect of the present invention to solve the above-mentioned problems provides the infrared detector according to the sixth aspect, characterized in that, the outer circumferential faces is formed to be inclined to the light acceptance surface, and the metal film is provided so as to cover and the convex-concave structure, whereby the metal film is provided to cover the outer circumferential faces formed to be thus inclined.

An eighth aspect of the present invention to solve the above-mentioned problems provides the infrared detector according to any one of the sixth and seventh aspect, characterized in that the light in the far- to middle-infrared band which enters the infrared detector is set to infrared in a wavelength range from 4 μm to 4.5 μm, the wavelength range including 4.257 μm which is an absorption wavelength of $CO_2$.

A ninth aspect of the present invention to solve the above-mentioned problems provides an infrared detecting apparatus characterized by including the infrared detector according to any one of the sixth and seventh aspects used therein.

Advantageous Effects of Invention

According to the first and fifth inventions, the light entering the detector is reflected between the convex-concave structure and the metal film over and over again to be confined inside the detector. Accordingly, an effective optical path length of the light entering the detector is made longer, and the absorption efficiency by the detector is improved, thereby achieving improvement in sensitivity.

According to the second and fifth inventions, the light converted by the detector is reflected between the convex-concave structure and the metal film over and over again to be confined inside the detector. Accordingly, an effective optical path of the converted light is made longer, and the absorption efficiency by the detector is improved, thereby achieving improvement in sensitivity.

According to the third, fifth, sixth, eighth and ninth inventions, the light entering the detector and the light converted by the detector are reflected between the convex-concave structure and the metal film over and over again to be confined inside the detector. Accordingly, effective optical path lengths of the light entering the detector and the converted light are both made longer regardless of the wave length, and absorption efficiencies thereof by the detector are improved. As a result, improvement in sensitivity as a total can be achieved. In cases where this configuration is applied to an infrared detector and to an infrared detection apparatus, sensitivity (an S/N ratio) thereof can be improved as compared to a conventional one employing a QWIP scheme or QDIP scheme.

According to the fourth and seventh inventions, the outer circumferential face other than the light acceptance surface is formed so as to be inclined to the light acceptance surface, and the outer circumferential face is covered with the metal film. Accordingly, the light entering the detector and the converted light are reflected on the metal film in a manner oblique to a layer into which the light entering the detector and the converted light are absorbed. Thereby, effective optical path lengths of these lights are made even longer, and the absorption efficiency by the detector is improved. As a result, further improvement in sensitivity can be achieved.

BRIEF DESCRIPTION OF DRAWINGS

FIGS. 1A and 1B are views showing an infrared detector being one example of an embodiment of a light detector according to the present invention.

DESCRIPTION OF EMBODIMENTS

A light detector and a light detecting apparatus will be described below in detail with reference to FIGS. 1A to 5. Note that, although infrared is taken as an example of light to be detected, and an infrared detector and an infrared detecting apparatus for detecting the infrared are taken as one example of an embodiment in the following description, the present invention is applicable also to a light detector and a light detecting apparatus that detect light other than infrared, such as, for example, visible light and ultraviolet.

Example 1

Figures 1A, 1B:
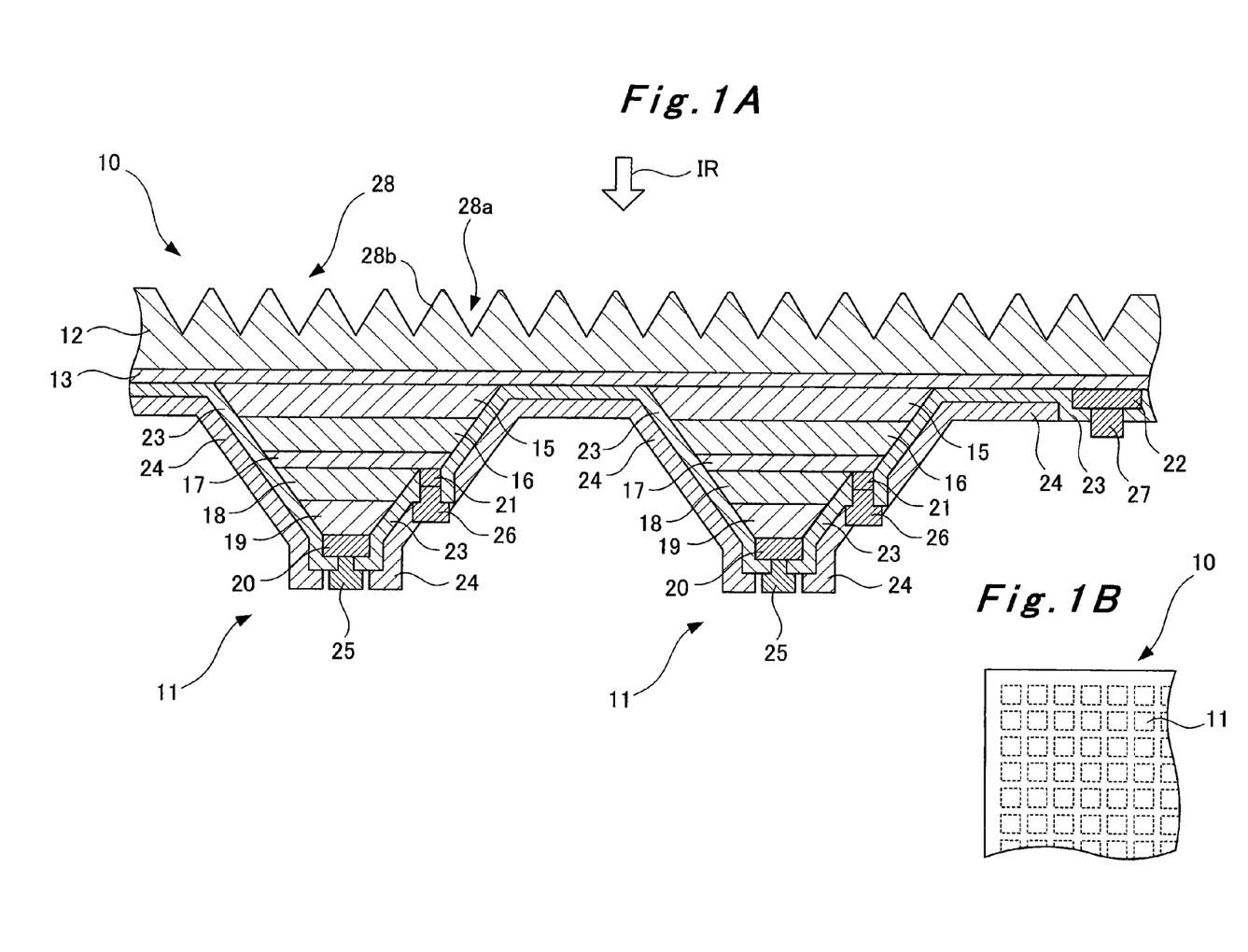
FIG. 1A is a cross-sectional view thereof.
FIG. 1B is a schematic view as seen from the light acceptance surface side thereof.

FIGS. 1A and 1B are views showing an infrared detector that is one example of the embodiment of a light detector according the present invention. FIG. 1A is cross-sectional view thereof, and FIG. 1B is a schematic view as seen from a light acceptance surface thereof.

The infrared detector 10 in this example is formed of multiple cells 11. For example, as shown in FIG. 1B, the multiple cells 11 each having a rectangular shape are arranged in a grid as seen from the light acceptance surface into which infrared IR enters. Note that, in FIG. 1A, if a side on which the cells 11 are formed is assumed to be a front surface of a substrate 12, the light acceptance surface side into which infrared IR enters is a back surface of the substrate 12. This means that the infrared detector 10 of this example employs a so-called back-surface incidence structure.

The cells 11 are formed on the substrate 12 and a contact layer 13 that are common to the cells 11. Additionally, each of the cells 11 includes: a photo-current generating layer 15 in which far- to middle-infrared (for example, a band having a wavelength from 2 to 12 μm) are absorbed, electrons are thereby excited, and photo-current is generated; a light-emitting layer 16 that emits near-infrared to visible light (for example, a band having a wavelength from 860 to 1000 nm) when the electrons of the photo-current generated in the photo-current generating layer 15 are injected therein and recombined with holes; a contact layer 17 that serves as an electrode common to the photo-current generating layer 15 and the light-emitting layer 16, and later described photo-absorption layer 18 and amplification layer 19; the photo-absorption layer 18 in which near-infrared to visible light emitted by the light-emitting layer 16 are absorbed, electrons are thereby excited, and photo-current is generated; and the amplification layer 19 that amplifies electrons of photo-current generated in the photo-absorption layer 18.

In the infrared detector 10 of this example, all of the contact layer 13, the photo-current generating layer 15, the light-emitting layer 16, the contact layer 17, the photo-absorption layer 18 and the amplification layer 19 are formed of a group III-V compound semiconductor (for example, GaAs-based materials), and all of these layers are integrally formed by being stacked on the substrate 12 formed of a group III-V compound semiconductor (for example, GaAs substrate). Accordingly, crystal can be grown to form the entire detector only by use of an MBE method. By integrally stacking the layers to form the entire detector only by using an MBE method as described above, a loss in near-infrared to visible light emitted by the light-emitting layer 16 and detected by the photo-absorption layer 18 can be reduced, thereby improving the sensitivity of the detector. Note that a formation method of the layers is not limited to an MBE method, and an MOCVD (metal-organic chemical vapor deposition) method or the like may be used.

Next, specific structures of the respective layers will be described.

The photo-current generating layer 15 is formed of a multiple quantum well structure or a multiple quantum dot structure. For example, in a case where the photo-current generating layer 15 is formed of a multiple quantum well structure, barrier layers and well layers serving as quantum wells are used. Here, each of the well layers is interposed between two of the barrier layers, and these layers are stacked multiply. This structure is an equivalent to a so-called QWIP, and is a superlattice structure having the barrier layers formed of AlGaAs and the well layers formed of GaAs, for example. On the other hand, in a case where the photo-current generating layer 15 is formed of a multiple quantum dot structure, barrier layers and quantum dots serving as quantum wells are used. Here, a large number of the quantum dots are buried in one of the barrier layers, and the barrier layers are stacked multiply. This structure is an equivalent to a so-called QDIP, and, is a structure having the barrier walls formed of AlGaAs and the quantum dots formed of InAs, for example.

Additionally, the light-emitting layer 16 includes barrier layers and well layers serving as quantum wells. Here, each of the well layers is sandwiched between two of the barrier layers so as to form a band gap that emits near-infrared to visible light, and these layers are stacked multiply to have a multiple quantum well structure. For example, the well layers are formed of InGaAs and the barrier walls are formed of GaAs. Note that the barrier layers may be formed of AlGaAs. Additionally, the barrier layer that is close to the photo-absorption layer 18 may be configured to also serve as the contact layer 17.

Additionally, the amplification layer 19 serves as an avalanche amplification layer, and the amplification layer 19 and the photo-absorption layer 18 constitute a so-called avalanche photodiode (APD). Although each the photo-absorption layer 18 and the amplification layer 19 may be formed only of, for example, a GaAs composition, the photo-absorption layer 18 may be formed of InGaAs, and the amplification layer 19 may be formed of AlGaAs. In a case where the photo-absorption layer 18 is formed of an InGaAs composition which is the same as that of the well layers of the light-emitting layer 16, absorption efficiency of the light may be improved since an InGaAs composition used for emitting light has a similar wavelength to that of the InGaAs composition used for absorbing the light. Note that the photo-absorption layer 18 and the amplification layer 19 are not limited to an APD, and a pin photodiode, a pn photodiode or the like may be used.

In addition, in this example, the photo-current generating layer 15 is formed so that wavelengths to be detected, that is, far- to middle-infrared light which excites electrons, are within a band having a wavelength ranging from 2 to 12 μm. Additionally, the light-emitting layer 16 and the photo-absorption layer 18 are formed so that near-infrared to visible light emitted by the light-emitting layer 16 and detected by the photo-absorption layer 18 are within a band having a wavelength ranging from 860 to 1000 nm (at room temperature).

Note that, this example describes a configuration where respective base compositions of the substrate and the layers are GaAs being a Group III-V compound semiconductor. However, respective semiconductor compositions of the substrate and the layers may be selected as appropriate in accordance with wavelengths to be detected. For example, in a case where wavelengths to be detected are desired to be in the range of 2 to 12 μm, the layers may be formed on a GaAs substrate by use of GaAs based materials (GaAs, AlGaAs, InGaAs, InAs and the like). In a case where wavelengths to be detected are desired to be longer, the layers may be formed on an InP substrate by use of GaAs based materials (GaAs, InGaAs, InAlAs, InGaAlAs, and the like). In a case where wavelengths to be detected are desired to be in the range of 2 to 10 μm, the respective layers only have to be formed on a sapphire substrate, a Si substrate, a SiC substrate or a GaN (Gallium Nitride) substrate by use of GaN based materials.

After the contact layer 13, the photo-current generating layer 15, the light-emitting layer 16, the contact layer 17, the photo-absorption layer 18 and the amplification layer 19 are sequentially stacked on the substrate 12, the cells 11 are formed by: applying anisotropic etching to the photo-current generating layer 15, the light-emitting layer 16, the contact layer 17, the photo-absorption layer 18 and the amplification layer 19 while leaving the contact layer 13 as it is so as to form cross-sectional structures having tapered shapes (as three-dimensional structures, quadrangular pyramid structures) in the layers as shown in FIG. 1A. On this occasion, it is desired that a large number of the cells 11 be formed by making spaces between adjacent ones of the cells 11 as narrow as possible.

Here, each of the cells 11 is formed to have a cross section having a tapered shape through anisotropic etching. However, the cross section is not necessarily required to be formed into a tapered shape if a later described mirror structure (a metal film 24 and the like) can be formed on an outer circumference of each cell 11, and may be formed into, for example, a rectangular shape, a semicircular shape, a stepped shape or the like. Note that, in a case where the later described mirror structure (the metal film 24 and the like) is formed through vapor deposition, the cross section having a tapered shape can cause the vapor deposition of a metal film to be performed easily, and also, makes it possible to condense infrared and internal light emission that are to be confined inside, as will be described later.

To each of the cells 11 whose cross section is formed into a tapered shape, an electrode portion 20 is formed through vapor deposition on the amplification layer 19 of the corresponding cell 11. Additionally, when the electrode portion 20 is formed, an electrode portion 22 electrically conducted to the contact layer 13 and an electrode portion 21 electrically conducted to the contact layer 17 are formed through vapor deposition. As a material for each of the electrode portions 20, 21 and 22, a metal material such as Au, AuGe, AuZn, or Al is used, for example. In particular, it is desirable that a material for the electrode portion 20 be one that reflects infrared of the above far- to middle-infrared band, and light in a near-infrared to visible band. Note that, although a contact layer similar to the above contact layers 13 and 17 actually exists between the amplification layer 19 and the electrode portion 20, this contact layer can also serve as one of layers constituting the amplification layer 19, and illustration thereof is therefore omitted here.

Thereafter, a protection film 23 is formed on an overall surface of each of the cells 11 whose cross section is formed into a tapered shape through vapor deposition. As a material for this protection film 23, it is desirable to use an insulator that transmits infrared of the above far- to middle-infrared band, and light in the near-infrared to visible band. An example of such insulators are an infrared optical material such as LiF or $MgF_2$ whose refractive index is not more than a refractive index $n_{GaAs}$=3.4. This protection film 23 also has a function of insulating the later described metal film 24 and layers inside the protection film 23 from each other.

In the protection film 23 formed on the overall surface of each of the cells 11, contact holes are formed in locations where the respective electrode portions 20, 21 and 22 exist. Then, electrode terminals 25, 26 and 27 electrically connected to the electrode portions 20, 21 and 22 through the contact holes, respectively, are formed through vapor deposition. As a material for each of electrode terminals 25, 26 and 27, for example, a metal material such as Au, Cu, Cr, Ti, Al is used.

Thereafter, the metal film 24 is formed on the overall surface of each of the cells 11 through vapor deposition. As a material for this metal film 24, for example, a metal material such as Au or Ag is used, for example, whereby the mirror structure covering the outer circumferential faces of each of the cells 11 is provided. It is desirable that the material for this metal film 24 be changed in accordance with a wavelength band of light that should be confined inside the cells 11. For example, it is preferable that the material be a metal material such as Au or Ag in the case of confining infrared of the above far- to middle-infrared band and of confining light of the near-infrared to visible band, and that the material be a metal material such as Al and Ag in the case of confining visible light.

Each of the electrode portions 21 functions as a part of the mirror structure. It is necessary to provide a gap (for example, a groove or the like) between the electrode terminal 26 conducted to this electrode portion 21 and the metal film 24 in order to prevent conduction (short-circuiting) between the electrode terminal 26 and the metal film 24. Here, it is desirable that leakage of infrared and light from this gap be prevented as much as possible by making the gap as narrow as possible and by arranging the electrode portion 21 and an edge portion of the metal film 24 in the vicinity thereof to overlap each other when being seen from the lower side of FIG. 1A.

Additionally, each of the electrode portions 20 also functions as a part of the mirror structure. It is necessary to provide a gap (for example, a groove or the like) between the electrode terminal 25 conducted to this electrode portion 20 and the metal film 24 to prevent conduction (short-circuiting) between the electrode terminal 25 and the metal film 24. Here, it is desirable that leakage of infrared and light from this gap be prevented as much as possible by making the gap as narrow as possible, and by arranging the electrode portion 20 and an edge portion of the metal film 24 in the vicinity thereof to overlap each other when being seen from the lower side of FIG. 1A.

Through the above described arrangement of the contact layers 13 and 17, the electrode portions 20, 21 and 22 and the electrode terminals 25, 26 and 27, a grounded common electrode (the contact layer 17, the electrode portion 21 and the electrode terminal 26) are provided between the photo-current generating layer 15 and light-emitting layer 16 side and the photo-absorption layer 18 and amplification layer 19 side. In addition, a positive electrode (the electrode portion 20 and the electrode terminal 25) and a negative electrode (the contact layer 13, the electrode portion 22 and the electrode terminal 27) are provided to both end portions of each of the cells 11. Then, a predetermined voltage is applied to an entirety of the detector, whereby the detector is driven. This contact layer 13 functions as a common electrode for all of the cells 11.

Additionally, on a backside surface of the substrate 12, that is, on the light acceptance surface for infrared IR, a convex-concave structure 28 is formed through anisotropic etching, and a cross section thereof is formed into triangular wave shape as shown in FIG. 1A. For example, in a case where the substrate 12 is made of GaAs and an original surface is the (001) plane, a cutout for each of V-shaped grooves 28a is formed by applying wet etching to the original surface (by use of, for example, a sulfuric-acid and hydrogen-peroxide based solution, an ammonia based solution, or the like). Thereby, sloped faces 28b having the {111} plane can be formed. These V-shaped grooves 28a are formed to have a certain size depending on wavelengths of entering light, or a kind (for example, a QWIP, a QDIP or the like) of the photo-current generating layer 15, and is desired to be several hundred nm to several ten μm in cases where the entering light is infrared and visible light. Additionally, the V-shaped grooves 28a may be linearly formed parallel to each other on the backside surface of the substrate 12, or may be formed in a grid shape in which the V-shaped grooves 28a are longitudinally and laterally formed so as to intersect each other. By the convex-concave structure 28, the light acceptance surface is formed on which a distribution of refractive indexes for the entering infrared IR appears to continuously change. Accordingly, surface reflection of the entering infrared IR on the light acceptance surface can be reduced. Additionally, an incident angle of the infrared IR perpendicularly-incident on the light acceptance surface can be refracted, and this is beneficial particularly in a case where the QWIP structure is employed as the photo-current generating layer 15.

Note that, it is desirable that the slope face 28b is formed so as to form a Brewster angle with respect to the infrared IR perpendicularly-incident on the light acceptance surface. The slope face 28b may be formed so as to form an angle close to the Brewster angle by utilizing an etching characteristic of the GaAs substrate having the (001) plane as in this example. By utilizing such an etching characteristic, formation of the convex-concave structure 28 can be carried out through an inexpensive and simple method. Note that, for example, a stripe structure, a texture structure, an inverse-pyramid structure (a structure where recessed portions of pyramids are formed), a honeycomb structure (a structure where recessed portions of six-sided pyramids are formed) or the like also can be applied as the convex-concave structure 28.

Additionally, the convex-concave structure 28 also performs a function of causing the infrared IR entering the light acceptance surface and then reflected on the metal film 24, and light emitted from the light-emitting layer 16 to be reflected and scattered by inner faces of the convex-concave structure 28, thereby suppressing these lights from leaking out to the outside of the cells 11, as will be later described in connection with FIGS. 2 and 3. For example, a difference in refractive index between the convex-concave structure 28 and the outside thereof (for example, a vacuum) causes total reflection of these lights if these lights enter a inner surface of the convex-concave structure 28 with incident angles not less than 18°, and also can cause these lights to be scattered inside the cell 11 in a case where the convex-concave structure 28 is formed to have periodic structures smaller than wavelengths of lights to be confined.

Here, with reference to FIGS. 2 and 3, optical path of light in the infrared detector 10 of this example will be described after the operating principles of the infrared detector 10 of this example is schematically described. Note that, FIG. 2 is a view explaining an optical path of the infrared IR, and FIG. 3 is a view explaining an optical path of internal light emission emitted by the light-emitting layer 16 inside the infrared detector 10.

Figure 2:
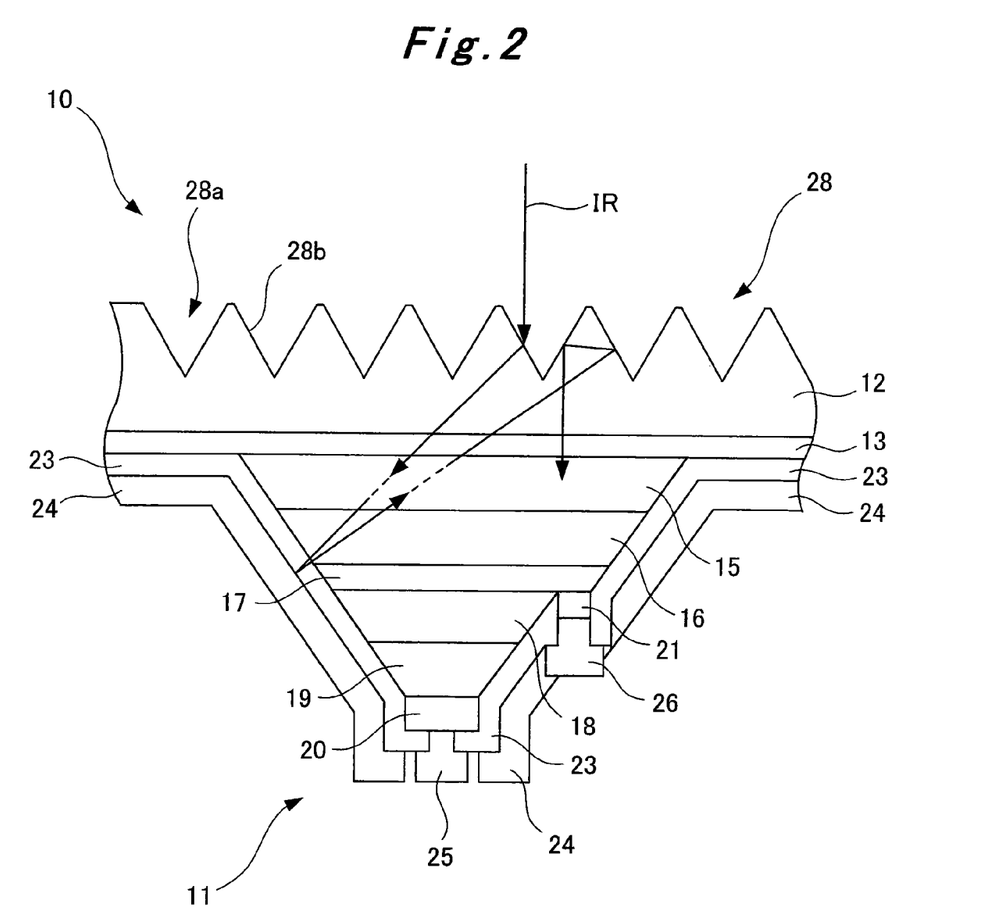
FIG. 2 is a view explaining an optical path of entering infrared in the infrared detector shown in FIGS. 1A and 1B.

The infrared IR that enters the light acceptance surface of the infrared detector 10 is refracted by one of the slope faces 28b of the convex-concave structure 28, enters the cell 11 side at an angle inclined to an original incident angle, passes through the substrate 12 and the contact layer 13, and then enters the photo-current generating layer 15 (refer to FIG. 2).

In the photo-current generating layer 15, multiple quantum wells are formed by using well layers, quantum dots or the like, and electrons exist at an energy level of the conduction band side in the quantum wells. These electrons are excited by absorbing the entering infrared IR passing through the substrate 12 and the contact layer 13. The thus excited electrons are to be injected into the light-emitting layer 16. Here, employment of the multiple quantum well structure or multiple quantum dot structure enables efficient absorption of the entering infrared IR thereby efficiently exciting the electrons. Note that, although details of the following will be described later, a part of the infrared IR, which passes through the photo-current generating layer 15 without being absorbed thereby, is confined inside the cell 11 to be absorbed over and over again by the photo-current generating layer 15. Accordingly, the entering infrared IR can be further efficiently absorbed thereby further efficiently exciting the electrons.

In the light-emitting layer 16 also, multiple quantum wells are formed by using well layers, and holes exist at an energy level of the valence band side in the quantum wells. These holes and the electrons injected from the photo-current generating layer 15 are recombined together, whereby near-infrared to visible light having larger energy is emitted. Here, employment of the multiple quantum well structure enables efficient recombination of the electrons injected from the photo-current generating layer 15 and the holes in the light-emitting layer 16, so that the above near-infrared to visible light is efficiently emitted.

Figure 3:
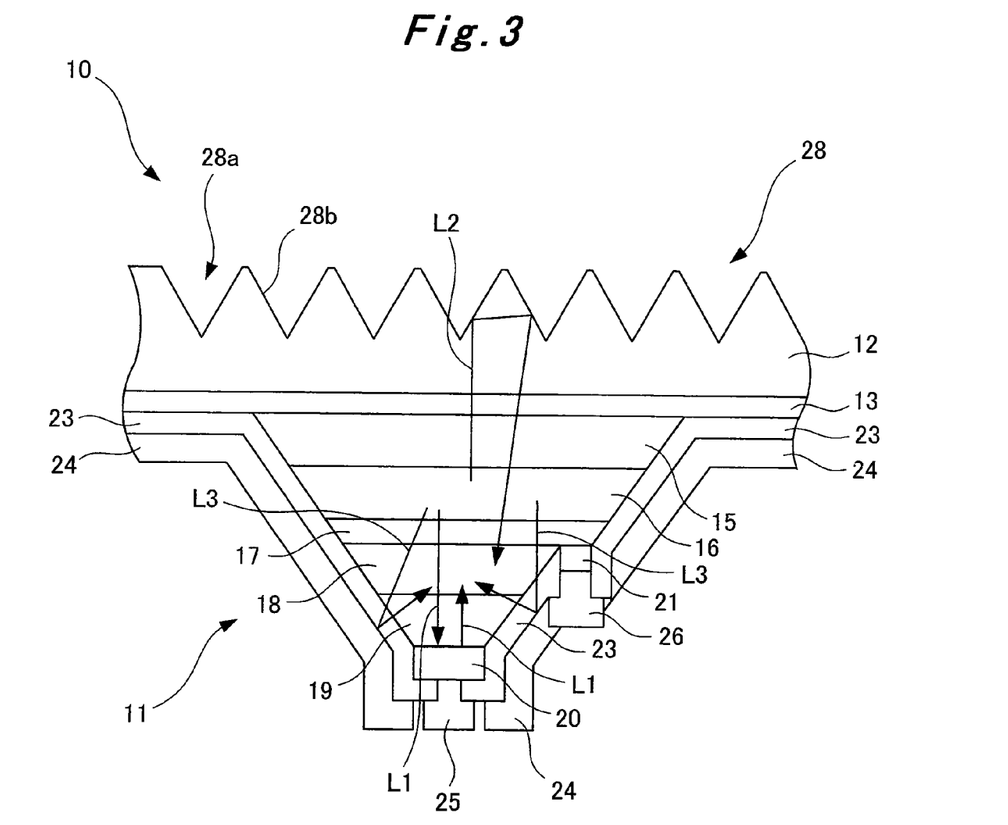
FIG. 3 is a view explaining optical path of internal light emission emitted inside the infrared detector shown in FIGS. 1A and 1B.

The thus emitted near-infrared to visible light is emitted mainly in a stacking direction of the cell 11 (refer to light beams L1 and L2 in FIG. 3). The light beam L1 emitted toward the photo-absorption layer 18 directly enters the photo-absorption layer 18, and then, intensity thereof is detected in the photo-absorption layer 18. Meanwhile, the light beam L2 emitted toward the substrate 12 is reflected on an inner face of the convex-concave structure 28 and thereafter enters the photo-absorption layer 18, and then, intensity thereof is detected in the photo-absorption layer 18. As a result, the near-infrared to visible light emitted from the light-emitting layer 16 is detected in high efficiency by the photo-absorption layer 18. Note that, although details will be described later, a part of the near-infrared to visible light, which passes through the photo-absorption layer 18 without being absorbed thereby, is confined inside the cell 11 to be absorbed over and over again by the photo-absorption layer 18. Accordingly, the near-infrared to visible light due to internal light emission can be further efficiently absorbed.

Since a reverse bias is applied to the photo-absorption layer 18 and the amplification layer 19, a high electric field is formed in a depletion layer in the photo-absorption layer 18. The entering light is absorbed by this photo-absorption layer 18, electron-hole pairs are formed, and these carriers (electrons and holes) are accelerated by the high electric field. The thus accelerated carriers collide with a lattice while having high energy levels, whereby secondary electron-hole pairs are generated. Then, this process is repeated in the amplification layer 19, and the carriers are avalanche-multiplied. Thereafter, the avalanche-multiplied carriers drift to form a photo-current. In other words, the near-infrared to visible light emitted from the light-emitting layer 16 is amplified in the photo-absorption layer 18 and the amplification layer 19, and then detected. This enables far- to middle-infrared entering the cell 11 to be efficiently detected.

Furthermore, in this example, since each of the cells 11 has a structure capable of confining light therein, detection sensitivity in the photo-current generating layer 15 and detection sensitivity in the photo-absorption layer 18 can be further improved.

First of all, an optical path of the infrared IR and confinement of light will be described by use of FIG. 2.

As shown in FIG. 2, the infrared IR perpendicularly-incident on the light acceptance surface of the infrared detector 10 is refracted by one of the slope faces 28b of the convex-concave structure 28, and enters the cell 11 side at an angle inclined to an original incident angle. By thus refracting the perpendicularly-incident infrared IR to enter the photo-current generating layer 15 of the cell 11 at an angle inclined thereto, an effective optical length (an optical length that contributes to sensitivity and absorption in the photo-current generating layer 15) of the infrared IR in the photo-current generating layer 15 can be made longer. Accordingly, the absorption efficiency by, namely, the sensitivity of, the photo-current generating layer 15 can be improved.

Furthermore, the infrared IR passing through the photo-current generating layer 15 is reflected on the metal film 24 formed on the outer circumferential faces of the cell 11, and then enters the photo-current generating layer 15 again. Here, the infrared IR reflected on the metal film 24 also enters the photo-current generating layer 15 at an angle thereto. Accordingly, an effective optical length of the infrared IR in the photo-current generating layer 15 can be made longer, and the absorption efficiency by, namely, the sensitivity of, the photo-current generating layer 15 can be further improved.

Moreover, the infrared IR which is reflected on the metal film 24 and passes through the photo-current generating layer 15 again is diffused by the convex-concave structure 28 and enters the photo-current generating layer 15 again. In this case too, the infrared IR enters the photo-current generating layer 15 at an angle inclined thereto. Accordingly, an effective optical length of the infrared IR in the photo-current generating layer 15 can be made longer, and the absorption efficiency by, namely, the sensitivity of, the photo-current generating layer 15 can be further improved.

The infrared IR entering the cell 11 is confined inside the cell 11 by being reflected between the convex-concave structure 28 and the metal film 24 over and over again. As a result, the infrared IR passes through the photo-current generating layer 15 a number of times until being absorbed by the photo-current generating layer 15. Accordingly, together with the fact that the infrared IR obliquely passes through the photo-current generating layer 15, an effective optical length of the infrared IR in the photo-current generating layer 15 can be made even longer, and the absorption efficiency by, namely, the sensitivity of, the photo-current generating layer 15 can be additionally further improved.

Additionally, in a case where a QWIP structure (an n-type QWIP structure in particular) is employed in the photo-current generating layer 15, sensitivities for the infrared IR perpendicularly-incident on the photo-current generating layer 15 cannot be expected to be high. However, when the infrared IR enters the photo-current generating layer 15 at an angle inclined thereto as described above, not only the effective optical length can be made longer but also the sensitivity in the QWIP structure can be improved.

Next, optical path of internal light emission emitted by the light-emitting layer 16 and confinement of light will be described by use of FIG. 3.

As has been described above, the near-infrared to visible light emitted by the light-emitting layer 16 is emitted mainly in the stacking direction of the cell 11. The light beam L1 emitted toward the photo-absorption layer 18 directly enters the photo-absorption layer 18, and then, intensity thereof is detected in the photo-absorption layer 18. Furthermore, after passing through the photo-absorption layer 18, the light beam L1 is reflected on the electrode portion 20 formed in the end portion of the cell 11, and enters the photo-absorption layer 18 again, and then, intensity thereof is detected. Accordingly, an effective optical length (an optical length that contributes to absorption and sensitivity in the photo-absorption layer 18) of the light beam L1 in the photo-absorption layer 18 can be made longer, whereby an absorption efficiency by, namely, a sensitivity of, the photo-absorption layer 18 can be improved.

On the other hand, the light beam L2 emitted toward the substrate 12 is reflected on the inner face of the convex-concave structure 28 and enters the photo-absorption layer 18, and then intensity thereof is detected in the photo-absorption layer 18. Additionally, a light beam that is emitted in a direction different from the stacking direction of the cell 11 among light beams emitted toward the substrate 12 is reflected on the inner face of the convex-concave structure 28, and thereafter enters the photo-absorption layer 18 directly or indirectly (by being reflected on the metal film 24). Then, intensity of the light beam is detected in the photo-absorption layer 18. Thereby, the light beam L2 emitted from the light-emitting layer 16 toward the substrate 12 is detected by the photo-absorption layer 18. Accordingly, the absorption efficiency by, namely, the sensitivity of, the photo-absorption layer 18 can be further improved.

A light beam that is emitted in a direction different from the stacking direction of the cell 11 among the light beams emitted toward the photo-absorption layer 18, and a light beam that is not reflected on the electrode portion 20 even though being emitted in the stacking direction of the cell 11 (these light beams are collectively referred to as a light beam L3) directly enter the photo-absorption layer 18, and then, intensity thereof is detected in the photo-absorption layer 18. Furthermore, after passing through the photo-absorption layer 18, the light beam L3 is reflected on the metal film 24 formed on the outer circumferential faces of the cell 11, and enters the photo-absorption layer 18 again, and then intensity thereof is detected. At this time, the light beam L3 enters the photo-absorption layer 18 at an angle inclined thereto, whereby an effective optical length of the light beam L3 in the photo-absorption layer 18 can be made longer, and the absorption efficiency by, namely, the sensitivity of, the photo-absorption layer 18 can be further improved. That is, the metal film 24 is arranged so as to focus light to the photo-absorption layer 18.

In addition, internal light emission emitted by the light-emitting layer 16 inside the cell 11 is confined inside the cell 11 by being reflected between the convex-concave structure 28 and the metal film 24 over and over again. As a result, the internal light emission passes through the photo-absorption layer 18 a number of times until being absorbed by the photo-absorption layer 18. Accordingly, together with the fact that the infrared IR obliquely passes through the photo-absorption layer 18, an effective optical length of the internal light emission in the photo-absorption layer 18 can be made even longer, and the absorption efficiency by, namely, the sensitivity of, the photo-absorption layer 18 can be additionally further improved.

The infrared detector 10 of this example employs a light confining structure described above to confine, in the cell 11, the infrared and the internal light emission which each have a wavelength band different from each other. Here, the effective optical lengths of the respective infrared and the internal light emission are made longer. As a result the absorption efficiency can be improved regardless of the wavelength of the light, and improvement in sensitivity as a total can be achieved. For example, the sensitivity can be improved by several times to several tens of times compared to an infrared detector of conventional QWIP scheme or QDIP scheme. As a matter of course, the above described light confining structure can be applied to a conventional infrared detector to improve detection sensitivity thereof. For example, the above described light confining structure can be simply provided in a light acceptance surface and an outer surface of a conventional infrared detector utilizing QDIP (or QWIP).

Additionally, since the infrared detector 10 of this example uses a GaAs substrate, the infrared detector 10 can be formed to have a large diameter, whereby an image sensor having a large number of pixels can be readily formed. Additionally, since processes of the MBE method are well-established, and all of the contact layer 13, the photo-current generating layer 15, the light-emitting layer 16, the contact layer 17, the photo-absorption layer 18 and the amplification layer 19 are formed only by use of crystal growth of this MBE method, a yield in production thereof can be high.

Note that, although the photo-current generating layer 15 and the light-emitting layer 16 have been described as n-type devices using electrons as carriers in this example, these layers may be formed as p-type devices using holes as carriers.

Example 2

Figure 4:
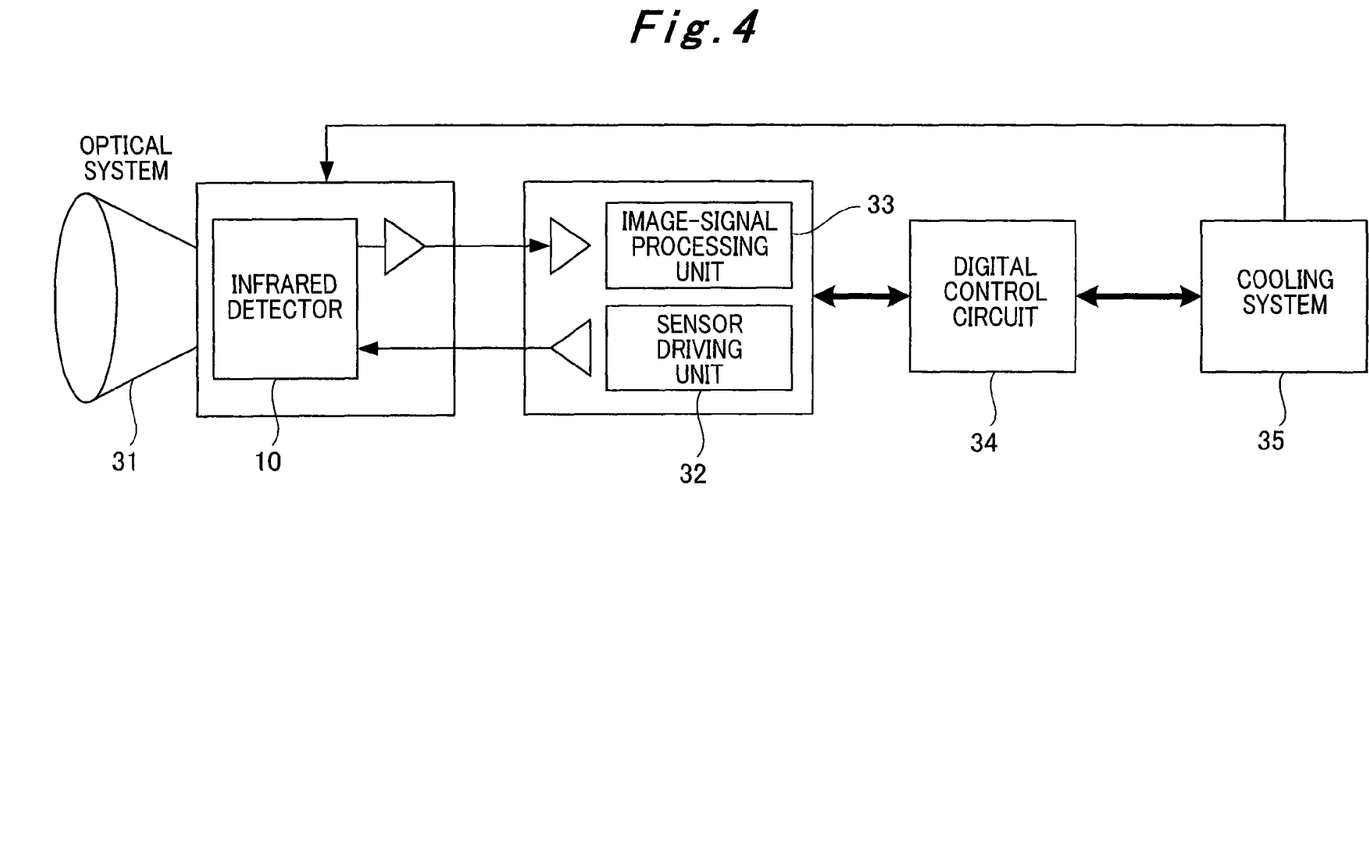
FIG. 4 is a block diagram showing an infrared detecting apparatus being one example of the embodiment of a light detecting apparatus according to the present invention.

FIG. 4 is a block diagram showing one example of the embodiment of an infrared detecting apparatus according to the present invention.

The infrared detecting apparatus of this example includes: the infrared detector 10; an optical system 31 provided on an incident surface side of the infrared detector 10; a sensor driver 32 that drives and controls the infrared detector 10; an image signal processor 33 that performs processing on image signals detected by the infrared detector 10; a digital control circuit 34 that controls the sensor driver 32 and the image signal processor 33; and a cooling system 35 that is controlled by the digital control unit 34 and cools the infrared detector 10.

Since the infrared detector 10 shown in Example 1 described above is used in this example, sensitivities of the infrared detecting apparatus can be improved as compared to a conventional infrared detecting apparatus.

The thus composed infrared detecting apparatus, for example, can be mounted on a satellite to observe a particular wavelength range on the surface of the earth, and thereby observing a state of the atmosphere of the earth, and a state of the surface of the earth. Alternatively, this infrared detecting apparatus can be used to observe a state of a celestial body by conducting astronomical observation without being affected by infrared on the earth.

Figure 5:
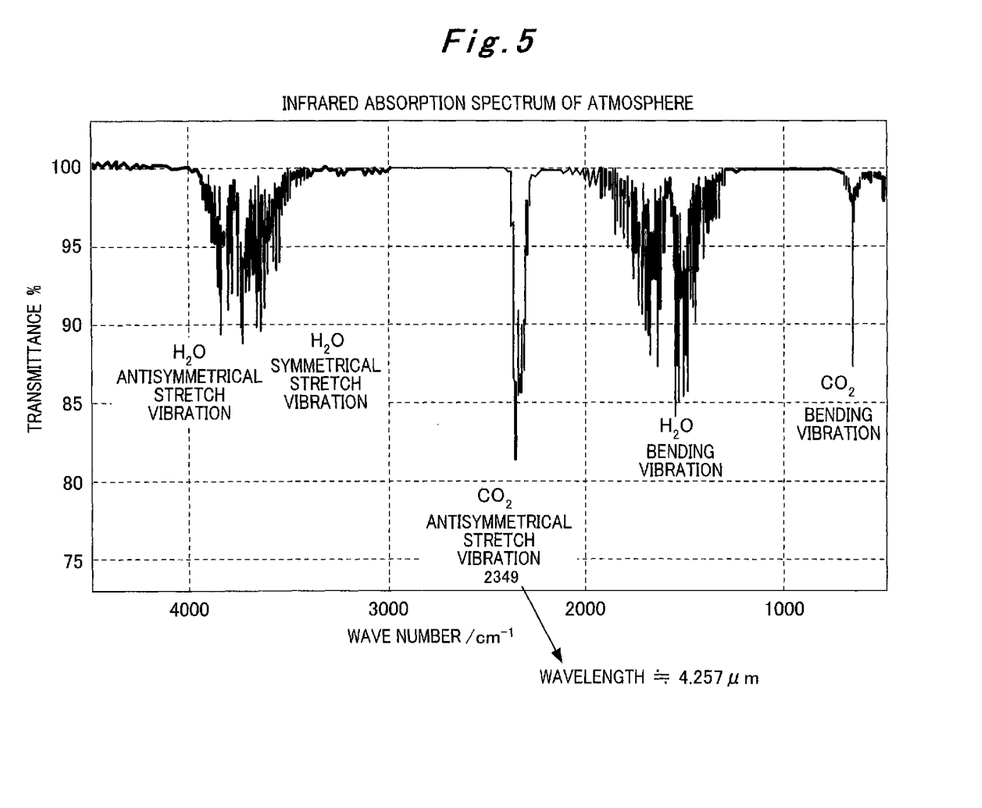
FIG. 5 shows infrared absorption spectra of the atmosphere.

Furthermore, by having the photo-current generating layer 15 formed into a certain structure, the infrared detecting apparatus can be made to correspond to a particular wavelength range. Specifically, in response to a global warming issue, there is a current demand to observe concentration of carbon dioxide ($CO_2$) in the atmosphere with high efficiency and accuracy. As shown in FIG. 5, by appropriately configuring the QWIP structure or QDIP structure of the photo-current generating layer 15 so that the photo-current generating layer 15 has infrared detection sensitivities for a wavelength range (for example, a wavelength range not less than 4 μm and not more than 4.5 μm) including an absorption wavelength of $CO_2$ (4.257 μm), the infrared detecting apparatus can be made as an infrared detecting apparatus exclusively for $CO_2$ that observes concentrations of carbon dioxide ($CO_2$) in the atmosphere with high efficiency and accuracy.

For example, in the case of the photo-current generating layer 15 having the QWIP structure, the photo-current generating layer 15 can be configured to conform to the absorption wavelength (4.257 μm) of $CO_2$ if: each of the well layers is formed of GaAs having a film thickness of 3.1 nm; and each of the barrier layers is formed of $Al_{0.57}Ga_{0.43}As$ having a film thickness of at least 30 nm.

Then, if the infrared detecting apparatus exclusively for $CO_2$ configured as above is mounted on a satellite, concentrations of carbon dioxide ($CO_2$) in the atmosphere of the entire earth can be observed with high efficiency and accuracy. Since the infrared detector 10 shown in Example 1 described above is used in the apparatus, sensitivities of the infrared detecting apparatus can be improved as compared even to a conventional $CO_2$ detecting apparatus, and at the same time, influences from the other molecules can be eliminated.

INDUSTRIAL APPLICABILITY

The present invention is suitable for infrared sensors and infrared image sensors which are used for remote sensing of the earth and astronomical observation, and is applicable also to sensors that detect light other than infrared, which is, for example, ultraviolet or visible light, and to solar batteries.

REFERENCE SIGNS LIST

10 INFRARED DETECTOR
11 CELL
12 SUBSTRATE
13, 17 CONTACT LAYER
15 PHOTO-CURRENT GENERATING LAYER
16 LIGHT-EMITTING LAYER
18 PHOTO-ABSORPTION LAYER
19 AMPLIFICATION LAYER
20, 21, 22 ELECTRODE PORTION
23 PROTECTION FILM
24 METAL FILM
25, 26, 27 ELECTRODE TERMINAL
28 CONVEX-CONCAVE STRUCTURE

The invention claimed is:

1. A light detector for detecting light comprising:
   a convex-concave structure provided on a light acceptance surface of the light detector; and
   a metal film provided on an outer circumferential face of the light detector including on an opposite side of the light acceptance surface, but not on the light acceptance surface itself, the metal film covering the outer circumferential face, wherein
   light which enters the light detector after passing through the convex-concave structure is confined inside the light detector: by causing the light to be reflected on the metal film; and by causing light reflected on the metal film to be reflected on the convex-concave structure.

2. A light detector which converts light entering the light detector into light in a different wavelength band, and which detects the converted light in the different wavelength band, the light detector comprising:
   a convex-concave structure provided on a light acceptance surface of the light detector; and
   a metal film provided on an outer circumferential face of the light detector including on an opposite side of the light acceptance surface, but not on the light acceptance surface itself, the metal film covering the outer circumferential face, wherein
   the converted light in the different wavelength band is confined inside the light detector by causing the light to be reflected between the metal film and the convex-concave structure.

3. A light detector which converts light entering the light detector into light in a different wavelength band, and which detects the converted light in the different wavelength band, the light detector comprising:
   a convex-concave structure provided on a light acceptance surface of the light detector;
   a metal film provided on an outer circumferential face of the light detector including on an opposite side of the light acceptance surface, but not on the light acceptance surface itself, the metal film covering the outer circumferential face, wherein
   light which enters the light detector after passing through the convex-concave structure and the converted light in the different wavelength band are confined inside the light detector: by causing the light entering the light detector to be reflected on the metal film; by causing light reflected on the metal film to be reflected on the convex-concave structure; and by causing the converted light in the different wavelength band to be reflected between the metal film and the convex-concave structure.

4. The light detector according to any one of claims 1 to 3, wherein, the outer circumferential face is formed to be inclined to the light acceptance surface, and the metal film is provided to cover the outer circumferential face formed to be thus inclined.

5. A light detecting apparatus comprising the light detector according to any one of claims 1 to 3 used therein.

6. An infrared detector which converts entering light in far- to middle-infrared band into light in near-infrared to visible band and which detects the converted light in the near-infrared to visible band, the infrared detector comprising:

a convex-concave structure provided on a light acceptance surface of the infrared detector; and a metal film provided on an outer circumferential face of the infrared detector including on an opposite side of the light acceptance surface, but not on the light acceptance surface itself, the metal film covering the outer circumferential face, wherein light in the far- to middle-infrared band which enters the infrared detector after passing through the convex-concave structure and the converted light in the near-infrared to visible band are confined inside the infrared detector: by causing the light in the far- to middle-infrared band which enters the infrared detector to be reflected on the metal film; by causing light in the far- to middle-infrared band which is reflected on the metal film to be reflected on the convex-concave structure; and by causing the converted light in the near-infrared to visible band to be reflected between the metal film and the convex-concave structure.

7. The infrared detector according to claim 6, wherein, the outer circumferential face is formed to be inclined to the light acceptance surface, and the metal film is provided to cover the outer circumferential faces formed to be thus inclined.

8. The infrared detector according to any one of claims 6 and 7, wherein the light in the far- to middle-infrared band which enters the infrared detector is set to infrared in a wavelength range from 4 μm to 4.5 μm, the wavelength range including 4.257 μm which is an absorption wavelength of $CO_2$.

9. An infrared detecting apparatus comprising the infrared detector according to any one of claims 6 and 7 used therein.

* * * * *